United States Patent [19]

Shelley

[11] 4,385,083

[45] May 24, 1983

[54] APPARATUS AND METHOD FOR FORMING A THIN FILM OF COATING MATERIAL ON A SUBSTRATE HAVING A VACUUM APPLIED TO THE EDGE THEREOF

[75] Inventor: Pierre Shelley, Santa Barbara, Calif.

[73] Assignee: Applied Magnetics Corporation, Goleta, Calif.

[21] Appl. No.: 181,088

[22] Filed: Aug. 25, 1980

[51] Int. Cl.³ .......................... B05D 3/12; B05D 3/00; C23C 13/08; B05C 11/02
[52] U.S. Cl. .................................... 427/240; 118/50; 118/52; 118/500; 118/501; 118/503
[58] Field of Search .................. 118/50, 52, 500, 501, 118/503; 427/240, 294

[56] References Cited

U.S. PATENT DOCUMENTS

| | | | |
|---|---|---|---|
| 2,386,591 | 10/1945 | Campbell | 118/52 |
| 3,389,682 | 6/1968 | Gardner | 118/52 |
| 3,426,727 | 2/1969 | Balain et al. | 118/52 |
| 3,538,883 | 11/1970 | Polin | 118/52 |
| 3,695,928 | 10/1972 | Boyer et al. | 118/52 |
| 3,705,048 | 12/1972 | Staunton | 118/52 |
| 3,834,613 | 10/1974 | Hankey | 118/52 |
| 3,993,018 | 11/1976 | Kranik et al. | 118/52 |

*Primary Examiner*—Michael R. Lusignan
*Assistant Examiner*—Janyce A. Bell
*Attorney, Agent, or Firm*—Daniel J. Meaney, Jr.

[57] ABSTRACT

Apparatus for forming a thin film of a coating material on a selected surface of a substrate and having a rotatable head fixture for supporting the substrate which includes a platen housing having a hollowed-out central area and an opening extending from an upper surface thereof into the hollowed-out central area, a substrate support means formed in the platen housing for supporting a substrate above the opening in the platen housing; means defining a chamber which encloses the substrate supporting means, the opening and part of the platen housing surface and wherein the chamber defining means is positioned relative to the periphery of the substrate to form a controlled gap which communicates with the opening and hollowed-out area; rotating means for rotating the platen housing and substrate at a predetermined rate of rotation and means for applying a vacuum through the hollowed-out area and opening to the controlled gap to draw and remove excess accumulation of coating material from the edge of the substrate formed thereon during rotation thereof by the rotating means is shown. A method for forming a thin film of coating material on a substrate by using a vacuum for removing excess coating material from the substrate during rotation thereof is shown.

20 Claims, 19 Drawing Figures

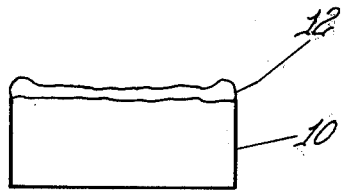
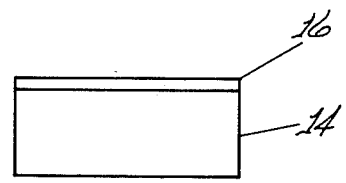
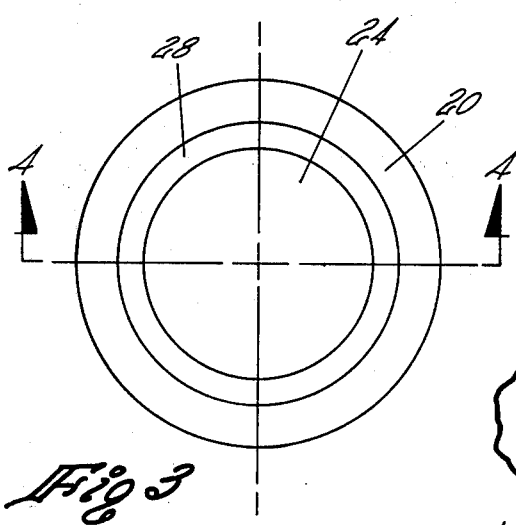
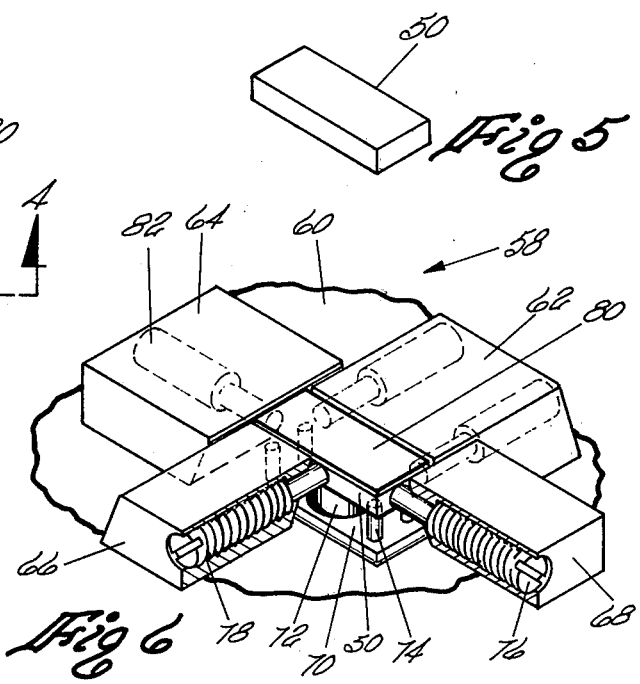
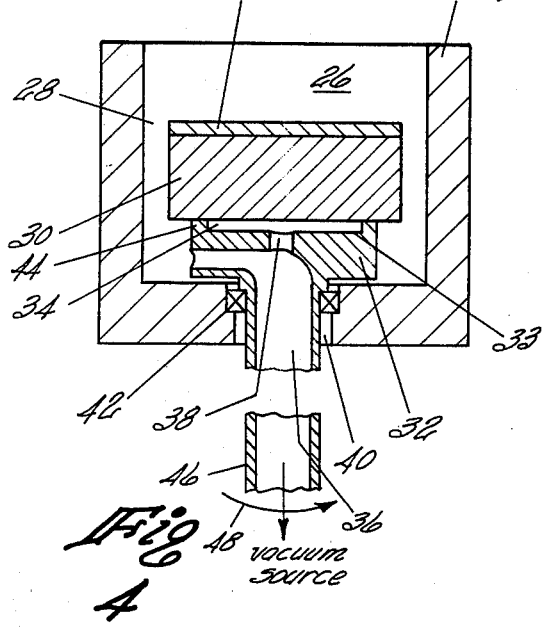
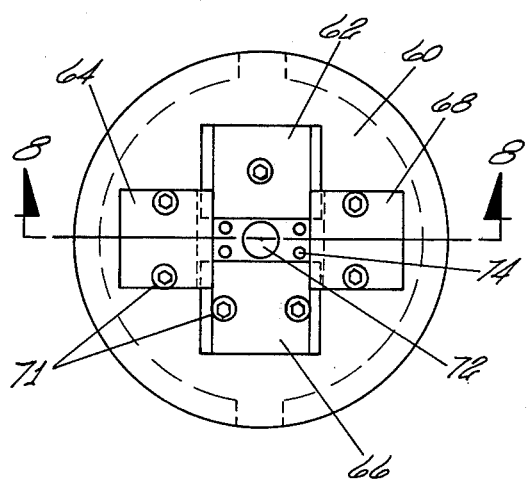

excess coating material formed on the edge of the substrate during rotation thereof into the controlled gap to establish a film of substantially uniform thickness of a coating material on the selected surface of a substrate.

The rotatable head fixture includes a platen housing having an upper surface, a lower portion, a hollowed-out central area and an aperture extending, in the preferred embodiment, from the upper surface of the platen housing into communication with the hollowed-out central area. A substrate support means is formed in the upper surface of the platen housing and positioned around the periphery of the aperture. The substrate support means receives and supports the substrate above the aperture with a selected surface of a substrate to be coated with the coating material positioned in opposed planar relationship to the upper surface.

Means defining a chamber encloses at least a portion of the upper surface of the platen housing. The chamber defining means is positioned relative to the periphery of the substrate to form a controlled gap therebetween. When a vacuum is applied to the hollowed-out area, a sub-ambient pressure is developed at the controlled gap and draws the excess coating material from the edge of the substrate resulting in a uniform film thickness of coating material.

In the preferred embodiment, the means defining the chamber comprises a plurality of slidable adjusting blocks which can have the edges thereof positioned a selected distance from the periphery of the substrate to form the controlled gap.

Substrates which are coated with photoresist material using the known prior art spinning apparatus must be trimmed to remove the edges having the edge accumulation. This results in less usable substrate surface area and reduced yields. When the edge of a substrate is chambered, this likewise results in less usuable substrate surface area and smaller yields.

The photoresist material spinning head tapered top plate engages the top edge of a substrate or wafer and prevents the coating material from reaching the edge thereof leaving a small annular portion of a substrate without photoresist material.

One advantage of the present invention is that the entire selected surface of the substrate is coated right to the edge thereof covering the entire substrate. Thus, the entire substrate surface is coated with a substantially uniform thickness of coating material and the entire coated surface is usable. This results in increased yields.

Another advantage of the present invention is that coating materials of different viscosities may be used and the thickness of the coating can be controlled by the rate of rotation versus the viscosity of the coating material which allows for a wide range of coating material and thickness of the coated film of material on a substrate. The width of the controlled gap and the magnitude of the sub-ambient pressure applied to the substrate edge controls the thickness of the film at the edge of the substrate.

Yet another advantage of the present invention is that a plurality of adjustable blocks can be used to accommodate substrates of different shapes with the preferable shape being rectangular.

Yet a further advantage of the present invention is that the substrate may be clamped in place mechanically, such as for example by adjusting alignment and clamping screws, or by use of a vacuum clamp.

BRIEF DESCRIPTION OF THE DRAWING

These and other objects and advantages of the invention, together with its various features and advantages, can be more easily understood from the following more detailed description of the preferred embodiment taken in conjunction with the accompanying drawing in which:

FIG. 1 is a plan and view of a substrate having a film of coating material formed thereon using prior art spinning apparatus wherein an edge accumulation of coating material is formed around the edge thereof;

FIG. 2 is a plan and view of a substrate having a film of coating material formed thereon using the apparatus and method of the present invention;

FIG. 3 is a top plan view of apparatus for coating a film of coating material on a circular substrate or wafer utilizing a vacuum for clamping a substrate against a substrate support means;

FIG. 4 is an end sectioned view taken along section lines 4—4 of FIG. 3;

FIG. 5 is an orthographic projection view of a rectangular substrate which, in the preferred embodiment, is adapted to have a substantially uniform film of photoresist material formed thereon using the teaching of this invention;

FIG. 6 is a partial perspective view partly in pictorial representation showing adjustable edge blocks, pin substrate supporting means and a substrate having a substantially uniform film of coating material formed thereon;

FIG. 7 is a top plan view of a rotatable head fixture having adjustable edge blocks and substrate supporting pins;

DESCRIPTION OF THE PREFERRED EMBODIMENT

Figure 8:
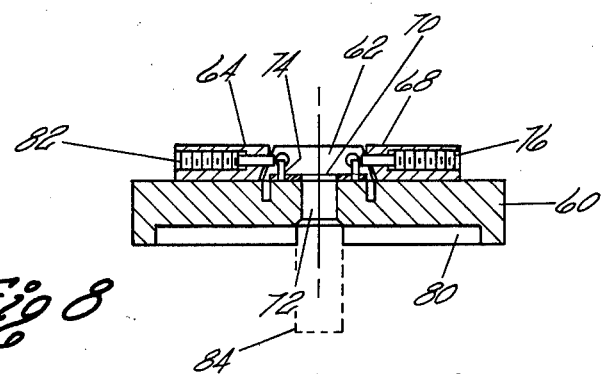
FIG. 8 is an end cross-sectional view taken along section lines 8—8 of the rotatable head fixture of FIG. 7.

FIG. 1 shows a substrate or wafer 10 having a coating material in a layer 12 which was applied using the prior art photoresist spinner apparatus. The edge of the layer 12 has a bulge formed therein due to the surface discontinuity wherein the surface of the coating material exhibits high adhesion at the substrate edge such that the centrifugal force urges the coating material into a ridge of excess accumulation at the substrate edge.

APPARATUS AND METHOD FOR FORMING A THIN FILM OF COATING MATERIAL ON A SUBSTRATE HAVING A VACUUM APPLIED TO THE EDGE THEREOF

BACKGROUND OF THE INVENTION

1. Field of the Invention

This invention relates to an apparatus and method for forming an intimate, substantially uniform layer of a coating material on a substrate or wafer. More specifically this invention relates to means for applying a vacuum in the vicinity of a controlled gap formed between a chamber and edge of a rotating substrate which removes excess coating material formed around the edge of a substrate during rotation thereof by a rotating or spinning means.

2. Description of the Prior Art

It is known in the prior art to utilize apparatus for rotating or spinning a substrate and during such rotation or spinning thereof to apply a controlled amount of photoresist coating material onto the spinning substrate to form a thin substantially uniform film of coating material on a selected surface of a substrate. Such apparatus are generally known as photoresist spinners. Typical of such apparatus is a model 101 Photoresist Spinner sold by Headway Research, Inc, Garland, Texas.

Methods are known for insuring that the film formed on the surface of a substrate is free of entrapped pockets of air during rotation. One method for accomplishing the above, which is disclosed in U.S. Pat. No. 3,862,856, is to cause a platform or platen surface, to which a substrate is attached, to oscillate in a shaking motion to produce a shearing force to lift minute pockets of air trapped at the liquid surface. The motor construction provides for mounting the substrate on a vacuum chuck with an output shaft holding the chuck having a liquid slinger to prevent the coating material from draining into the motor.

U.S. Pat. No. 3,974,797 discloses another known method for rotating a plurality of semiconductor slices in a support fixture. Initially, a support fixture containing semiconductor slices is dipped into a quantity of light sensitive or photoresist material or the semiconductor slices are sprayed with the photoresist material. The support fixture having the semiconductor slices containing the deposited photoresist material is rotated about its axis at a predetermined rate for a predetermined time in order to uniformly distribute a predetermined thickness of the light sensitive material over the entire surface area of the semiconductor slices.

Use of spinning apparatus for coating material on surfaces other than substrates or wafers is well known in the art. Typical of such art is U.S. Pat. No. 4,096,295 for coating lens or sheets wherein the items to be coated are placed into a tank containing fluid coating material, removed and spun to remove excess coating material from the sheet or lens surface.

U.S. Pat. No. 3,359,132 discloses a method of coating circuit paths or printed circuit boards with solder by submerging a printed circuit board having a flux applied thereto into a molten solder bath and then withdrawing the same from the bath and rapidly spinning the same to remove excess solder and form a smooth uniform coating having maximum surface adhesion.

U.S. Pat. No. 4,075,974 discloses apparatus for forming a uniform film of thermoplastic material on a conductive support member supported by a planar support mounted on a divisable turntable located in a housing which includes a dispenser mounted therein for delivering a charge of fluent material onto the member to be coated such that rotation of the member by the planar support distributes the fluent material radially outward coating the member.

In each of the apparatus described above, the centrifugal force developed by the rotation of the substrate causes the coating material to be urged toward the edge of the rotating surface to be coated. Where the material being coated is a substrate, an edge surface discontinuity exists in the surface tension of the film of coating material. As the centrifugal force urges the coating material toward the edge, the surface tension of the film causes a bulge in the edge of the film resulting in an edge accumulation of the coating material on the surface. After the coating material, such as the photoresist material, is dried, the substrate is usually trimmed to remove the edge accumulation.

In the specific application of coating a film of photoresist material on a substrate or wafer, it is desired to eliminate the edge accumulation at the edge of the substrate or wafer. One method used to eliminate the edge build-up is to machine a chamber around the edge of the substrate.

U.S. Pat. No. 4,086,870 discloses a novel photoresist material spinning head which uses a tapered top plate having a knife-edge contact to the surface of a substrate or wafer so as to seal the top of the wafer and prevent the photoresist material from flowing under the top. The knife-edge guides the excess photoresist material during spinning, onto the tapered top surface on the edge, which results in the excess photoresist material being spun off of the head.

The use of a vacuum to clamp workpieces while the same are being transported from a holding position into a working position is well known in the art. For example a positioning device for a flat rectangular workpiece using a vacuum for clamping such workpiece, such as a photograhic slide, during transporting thereof is disclosed in U.S. Pat. No. 3,950,095.

A blade and vacuum used for removing excess coating material scraped by the blade from a smoothing rod after the smoothing rod has coated a surface of a drum with developing powder are shown in U.S. Pat. No. 3,609,029.

SUMMARY OF THE PRESENT INVENTION

The invention disclosed herein relates to a novel and unique apparatus, method and rotatable head fixture for coating the entire surface of a spinning substrate or wafer with a coating material wherein the resultant layer of coating material has substantially uniform thickness over the entire substrate surface and eliminates edge accumulation of coating material which normally occurs at the edge of the spinning substrate or wafer.

The apparatus for forming a film of substantially uniform thickness of a coating material on a selected surface of a substrate includes a rotatable head fixture adapted for supporting the substrate, rotating means for rotating the rotatable head fixture and substrate at a predetermined rate of rotation and means for applying a vacuum to a controlled gap formed between a chamber defining means and the edge of the substrate to establish a sub-ambient pressure around the periphery of a substrate having a coating material applied thereto to draw FIG. 2 depicts a substrate or wafer 14 having a coating material in a layer 16 which was applied using the teaching and apparatus of the present invention. The layer 16 of coating material can be characterized as a film of substantially uniform thickness.

FIGS. 3 and 4 depict apparatus which is adapted to form a film 24 of substantially uniform thickness of a coating material on a selected surface of a substrate 30 having a circular shape. In the embodiment illustrated in FIGS. 3 and 4, the substrate is a circular wafer. In FIGS. 3 and 4, the apparatus includes a means defining a chamber, such as a containment chamber 20. The interior surface of the containment chamber 20 has an interior cavity 26 which encloses a platen housing 32 and the substrate 30 which is illustrated to have a film 24 of coating material formed thereon.

The interior surface of the containment chamber 20 is positioned relative to the periphery of the substrate 30 to form a controlled gap 28 therebetween. The dimension of the controlled gap 28 is dependent upon the coating material viscosity, coating temperature and rate of rotation of the platen housing 32 and substrate 30.

The platen housing 32 has an upper surface 33, a hollowed-out central area 36 extending axially therethrough and an aperture 38 extending from the upper surface 33 into communication with the hollowed-out area 36.

In the embodiment illustrated in FIG. 4, the hollowed-out central area 36 has an outlet 38 which extends to an exterior surface of the platen housing 32.

A substrate support means, such as lip 44, is formed in and extends from the upper surface 33 to define a passageway 34 which receives the substrate 30 above the aperture 38 with the selected surface of the substrate 30 which is to have the coating material affixed thereto in opposed planar relationship to the upper surface 33.

The platen housing 32 has a lower portion 40 which is adapted for attachment to a rotating means. The platen housing 32 is journaled in the containment housing 20 through a sealed bearing 42. The rotating means depicted by shaft 46, is adapted to rotate the head fixture comprising the platen housing 32 including substrate support lip 44 together with the substrate 30 at a predetermined rate of rotation shown by arrow 48.

A means including a vacuum source is coupled to the lower portion 40 of the platen housing 32 for applying a sub-ambient pressure through the hollowed-out central area 36 and the aperture 38 to apply a vacuum through the aperture 38 to the passageway defined by lip 44 to clamp and hold the substrate 30 against the lip 44 during rotation of the platen housing 32. In addition, the vacuum is applied to the controlled gap 28 to establish a sub-ambient pressure around the periphery of the substrate having the coating material applied thereto. The vacuum draws the excess coating material formed on the edge of the substrate during rotation thereof. In the embodiment illustrated in FIG. 4, the coating material is deposited onto the selected surface of the circular substrate 30 as it is rotated by shaft 46.

As noted in connection with the description of FIG. 4, the substrate 30 is circular in shape. In the embodiment of FIG. 4, a vacuum is used to clamp substrate 30 in position. However, it is envisioned that a mechanical clamping means could be used in lieu of the vacuum clamping. Of importance is that a vacuum is applied to the controlled gap to form a sub-ambient pressure around the periphery of substrate 30 to control the thickness of the film at the edge of the substrate.

FIG. 5 illustrates a rectangular shaped substrate 50 which is capable of being coated with a thin film of coating material using the apparatus and method of this invention. FIG. 6 illustrates one embodiment of apparatus for coating a rectangular shaped substrate 50 with a thin film of coating material.

FIG. 6 illustrates a rotatable head fixture, shown generally by arrow 58, adapted for supporting and spinning a substrate 50 during application of a coating material shown as layer 80. The fixture 58 includes a platen housing having an upper surface 60 having an aperture 72 which extends into the interior of the platen housing and into communication with a hollowed-out central area as shown in FIG. 8. A support plate 70 includes a plurality of spaced parallel support pins 74 formed around the periphery of the aperture 72. The support pins 74 receive and support the substrate 50 above the aperture 72.

In the embodiment of FIG. 6, the means defining a chamber includes four adjustable blocks 62, 64, 66 and 68. Adjusting blocks 66 and 68 are fragmented pivotally to show adjustable alignment and clamping screw 76 in adjusting block 68 and adjustable alignment and clamping screw 78 in adjusting block 66. The adjusting alignment and clamping screws in the other blocks 62 and 64 are shown in phantom, with the adjusting alignment and clamping screw shown by dashed lines 82 in block 64 as typical.

Figures 11, 12, 13:
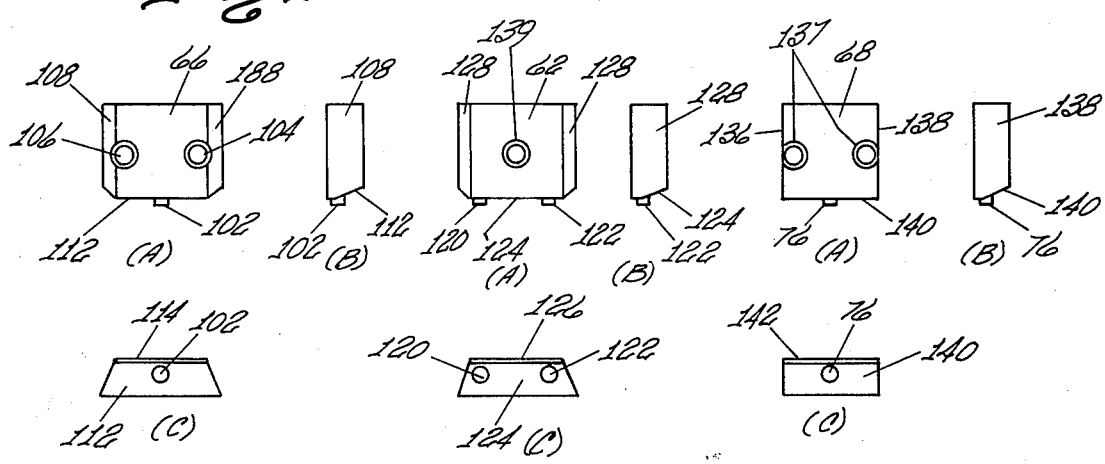
FIGS. 11(A), 11(B) and 11(C) are a plan top view, plan side view and plan front view of a single alignment and clamping screw, and adjustable end block having outwardly beveled side elements.
FIGS. 12(A), 12(B) and 12(C) are a plan top view, plan side view and plan end view of double alignment and clamping screws, and adjustable end block having outwardly beveled side elements.
FIGS. 13(A), 13(B) and 13(C) are a plan top view, plan side view and plan front view of a single alignment and clamping screw, and adjustable end block having vertical side walls and an inwardly beveled front element.

As illustrated in FIG. 7, the adjusting blocks are fastened to the upper surface 60 by screws shown as 71. Adjusting blocks 62 and 66 have outwardly beveled side walls which cooperate with inwardly beveled front walls in adjusting blocks 64 and 68. The details of the construction of the adjusting blocks are shown in greater detail in FIGS. 11 to 13, inclusive.

The adjusting blocks 62, 64, 66 and 68 when mounted on the upper surface 60 form a chamber which is rectangular in shape having a geometrical dimension slightly larger than that of the shape of the substrate 50. The adjustable alignment and clamping screws have flat ends as shown in the adjustable aligment and clamping screws 76 and 78 in FIG. 6. The adjustable alignment and clamping screws can be adjusted to guide the substrate 50 onto the support pins 74 and then the screws are tightened to mechanically clamp the substrate in position. Thus, slight variations in the geometrical dimensions of the substrate 50 can be compensated for by the adjustable alignment and clamping screws. Of importance is that the adjustable alignment and clamping screws clamp the sides of substrate 50 to hold the substrate 50 in position during rotation of the substrate 50 with the rotatable head fixture 58 which occurs during the coating process.

As shown in FIG. 6, the edges of the adjustable blocks 62, 64, 66 and 68 are spaced a predetermined distance from the periphery of the substrate 50 and that gap formed therebetween is the controlled gap.

Referring now to FIG. 8, illustrating the rotatable head fixture, adjusting blocks 62, 64 and 68 are shown with the flat ends of their respective adjustable alignment and clamping screws, for example screws 76 and 82, positioned relative to support pins 74. When a substrate is placed on the support pins, 74, it will seat with the bottom surface of the substrate contiguous the tip of the supporting pins 74 with the edge of the substrate nestled against the flat ends of the alignment and clamping screws. Thereupon, the alignment and clamping screws are adjusted to mechanically clamp the substrate in position on the supporting pins 74.

The aperture 72 extends axially through the upper surface 60 and into communication with a hollowed-out central area 80. A shaft, shown by dashed line 84 provides a path for the vacuum and rotation of the fixture.

The cooperating relationship between the various beveled sides of the adjusting block 62 and beveled front surfaces of adjusting blocks 64 and 68 is illustrated in FIG. 8 and the top surface of each adjusting block forms the edge which defines the controlled gap.

Figure 9:
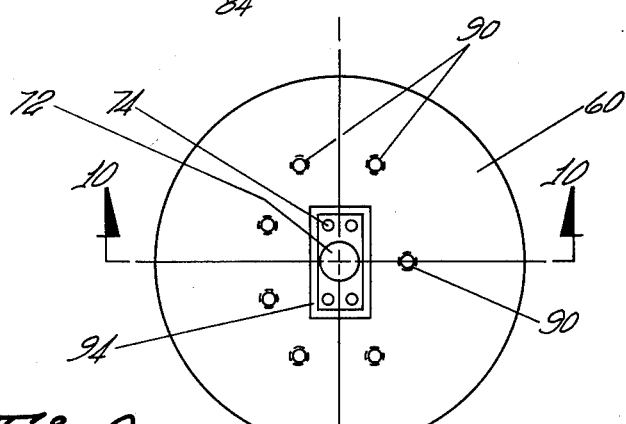
FIG. 9 is a top plan view of the upper surface of the platen housing showing aperture and pins for supporting a substrate above the aperture.

The upper surface 60 is shown in FIG. 9 with the location of the screw holes 90 shown in detail. The supporting pins 74 are located in pairs at each end of the support plate 70. A groove 94 is adapted to receive and seat the support plate 70 in the upper surface 60.

Figure 10:
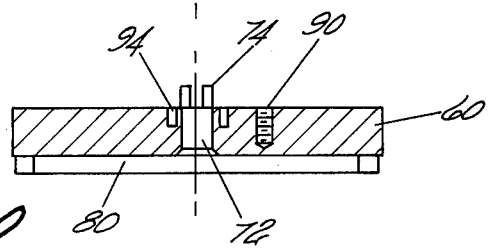
FIG. 10 is an end cross-sectional view taken along section lines 10—10 of FIG. 9, which shows the relationship between a typical fastener hole for the adjustable end blocks, the support pins and aperture.

FIG. 10 shows the relationship between the aperture 72, the hollowed-out central area 80 and the location of the support pins 74 relative to the groove 94 and aperture 72. The tapped hole 90 is typical of the tapped holes shown as 90 in FIG. 9.

When a vacuum is applied to the aperture 72, the vacuum is essentially contained within the front surfaces of the adjusting blocks 62, 64, 66 and 68 to apply a negative pressure in the controlled gap which sucks the excess coating material off of the edge of the substrate as the head fixture 58 is rotated by the rotating means.

FIGS. 11(A), 11(B) and 11(C) show the construction details of adjusting block 66 including the outwardly beveled sides 100 and inwardly beveled front edge 112. Screws 104 and 106 are located towards the edge of the block 66 to enable use of a single adjustable alignment and clamping screw 102 located in the center of the block 66. The narrow vertical surface section 114 in front surface 112 of block 66 of FIG. 11(C) cooperates with the periphery of the substrate to define a portion of the controlled gap.

FIGS. 12(A), 12(B) and 12(C) show the construction details of adjusting block 62 including the outwardly beveled sides 128 and inwardly beveled front edge 124. A single screw 138 is located in the center of the block 62 to enable use of two adjustable alignment and clamping screws 120 and 122 located toward the edges of block 62. The narrow vertical surface section 126 of front edge 124 in block 62 of FIG. 12(C) cooperates with the periphery of the substrate to define a portion of the controlled gap.

The construction of blocks 64 and 68 are identical and the construction details of block 68 are shown in FIGS. 13(A), 13(B) and 13(C). Screws 136 are located toward the edges of the block to provide for a single adjustable alignment and clamping screw 76. Front surface 140 is inwardly beveled while side surfaces 138 are vertical. The narrow vertical section 142 of front edge 140 in block 68 of FIG. 13(C) cooperates with the periphery of the substrate to define a portion of the controlled gap.

In practicing this invention using the embodiment of FIG. 6, ceramic substrates, which are rectangular in shape, are coated with a phototesist material. One example of such a substrate coated by use of the present apparatus and method is a glass ceramic substrate formed of a Corning Fotoceram brand glass ceramic. The glass ceramic substrate, in one embodiment, has a surface area of about eight square centimeters (8 cm$^2$) thickness of three millimeters (3 mm). A photoresist coating material of Shipley AZ brand positive photoresist is dispensed by means of a syringe to place a volume of about one tenth (1/10) of a cubic centimeter of photoresist material at a temperature of about 21° C. onto the selected surface of a substrate being rotated at 5000 RPM. A sub-ambient pressure of about 50 millibars was applied to the rotatable head fixture. The resulting film has a thickness of about one micrometer.

The method for forming the film of a coating material having a substantially uniform thickness on a substrate comprising the steps of clamping a substrate against a substrate support means; forming a controlled gap between the periphery of the clamped substrate and a chamber defining means; rotating the clamped substrate and substrate support means and chamber defining means at a predetermined rate of rotation; applying a predetermined volume of a coating material onto the selected surface of the substrate during rotation thereof such that the centrifugal force developed during rotation of the substrate uniformly distributes the coating material across the selected surface in a film having an edge accumulation of the coating material around the periphery of the selected surface of the substrate; and applying to the controlled gap a vacuum having a sub-ambient pressure of sufficient magnitude to draw the edge accumulation of coating material from the selected surface through the controlled gap to establish a film of substantially uniform thickness of the coating material on the selected surface of the substrate.

In use of a rotatable head fixture, the step of aligning the substrate between adjustable blocks and then mechanically clamping the same by use of adjustable alignment and clamping screws may first occur to seat and clamp the substrate in position.

What is claimed is:
1. Apparatus for forming a film of substantially uniform thickness of a coating material on a substrate comprising
   a platen housing having an upper surface, a hollowed-out central area extending axially therethrough and an aperture extending from said upper surface of said platen housing into communication with said hollowed-out central area;
   substrate support means including clamping means formed in the upper surface of a said platen housing and being adapted for receiving and clamping a said substrate above said aperture with a surface of a said substrate to be coated positioned in an opposed planar relationship to the upper surface;
   means defining a chamber enclosing at least a portion of the platen housing and substrate support means, said chamber defining means adapted to be positioned relative to the periphery of a said substrate to form a controlled gap, said controlled gap and said aperture communicating with said hollowed-out central area;
   rotating means operatively coupled to said platen housing for rotating said platen housing, said substrate support means and a said substrate adapted to be clamped thereon; and
   vacuum means operatively coupled to said platen housing for applying a vacuum pressure through said hollowed-out central area, said aperture to said controlled gap to apply a vacuum through said aperture to said controlled gap during rotation of said rotating means to establish a negative pressure around the periphery of a said substrate having a said coating material applied thereto which is adapted to draw excess material formed on the edge of a said substrate into said controlled gap through said hollowed-out central area and being adapted to establish a film of substantially uniform thickness of a said coating material on the surface of a said substrate to be coated.

2. The apparatus of claim 1 wherein said platen housing includes means defining an inlet located in a surface of the platen housing adjacent a said substrate; and said chamber defining means includes a containment chamber having an interior surface which is adapted to be spaced a selected distance from a said substrate which is rotated by said platen housing.

3. The apparatus of claim 1 wherein said clamping means includes a lip which extends from the surface of the platen housing into engagement with a surface of a said substrate to form a passageway in the vicinity of said aperture and enclosed by said aperture wherein the vacuum is applied through said aperture to the passageway to clamp a said substrate in position against the lip during rotation of the platen housing, substrate support means and a said substrate.

4. The apparatus of claim 1 wherein said substrate support means and said chamber defining means are located on the upper surface of the platen housing and are rotatable therewith.

5. The apparatus of claim 4 wherein said chamber defining means includes a plurality of adjustable blocks and said substrate support means are a plurality of spaced parallel pins.

6. The apparatus of claim 5 further comprising
at least one adjustable alignment and clamping screw positioned in each of said adjustable blocks and adapted to be adjusted to clamp a said substrate between the adjustable blocks and positioned over said spaced parallel pins.

7. Apparatus for forming a film of substantially uniform thickness of a coating material on a surface of a substrate comprising
a rotatable head fixture adapted for supporting a said substrate including
a platen housing having an upper surface, a lower portion adapted for attachment to a rotating means, a hollowed-out central area extending axially therethrough and an aperture extending from the upper surface of said platen housing in said upper surface into communication with said hollowed-out central area;
substrate support means including clamping means formed in the upper surface of said platen housing and positioned around the periphery of said aperture and being adapted for receiving and clamping a said substrate above said aperture with a surface of a said substrate to be coated being positioned in an opposed planar relationship to the upper surface;
means defining a chamber enclosing at least a portion of the upper surface of a said platen housing and said substrate support means, said chamber defining means being positioned relative to the periphery of a said substrate to form a controlled gap therebetween which communicates with said aperture and said hollowed-out central area;
rotating means operatively coupled to the lower portion of said platen housing to rotate said head fixture adapted to receive a said substrate; and
vacuum means operatively coupled to the lower portion of said platen housing for applying a vacuum through said hollowed-out central area and said aperture to said controlled gap during rotation of said substrate to establish a negative pressure around the periphery of a said substrate having said coating material applied thereto to draw excess coating material formed on the edge of a said substrate during rotation thereof into the controlled gap through said hollowed-out central area and being adapted to establish a film of substantially uniform thickness of a said coating material on a surface of a said substrate to be coated.

8. The apparatus of claim 7 wherein said substrate support means includes
a support plate positioned around the periphery of said aperture located in the upper surface of said platen housing; and
two pairs of spaced aligned parallel support pins with each pair of pins located in opposed spaced relationship to each other on opposite sides of said aperture and in alignment with the axis of said aperture.

9. The apparatus of claim 8 wherein said chamber defining means comprises
a first and second adjustable block mounted on said upper surface and each having outwardly beveled side walls and an inwardly beveled front wall and a narrow vertical portion located on the front wall adjacent the surface opposed to the surface contiguous said upper surface, said first and second adjustable block being mounted on opposite sides of the aperture with one pin from each pair of pins adjacent from front wall; and
a third and fourth adjustable block mounted on said upper surface with each having substantially vertical side walls and an inwardly beveled front wall and a narrow vertical portion located on the front wall adjacent the surface opposed to surface contiguous said upper surface, said third and fourth adjustable blocks being mounted on opposite sides of the aperture with said inwardly beveled front wall cooperating with an outwardly beveled side wall of at least one of the first and second adjustable blocks with one pair of pins located adjacent the front wall of each of the third and fourth adjustable blocks.

10. The apparatus of claim 9 wherein each adjustable block has at least one adjustable alignment and clamping screw extending therethrough in a plane parallel to said upper surface and wherein each end of each adjustable alignment and clamping screw is directed towards said aperture.

11. The apparatus of claim 10 wherein at least one of said first and second adjusting blocks has two parallel adjustable alignment and clamping screws.

12. A rotatable head fixture adapted for supporting and spinning a substrate during application of a coating material tereon comprising
a platen housing having an upper surface, a lower portion adapted for attachment to a rotating means, a hollowed-out central area extending axially therethrough and an aperture extending from the upper surface of said platen housing into communication with said hollowed-out central area;
substrate support means including changing means formed in the upper surface of a said platen housing and around the periphery of said aperture adapted for receiving and clamping a said substrate above said aperture with a surface of a said substrate to be coated being positioned in an opposed planar relationship to the upper surface; and means defining a chamber enclosing at least a portion of the platen housing and said substrate support means, said chamber defining means being adapted to be positioned relative to the periphery of a said substrate, to form a controlled gap therebetween which communicates with said aperture and said hollowed-out central area, said hollowed-out central area being adapted to have a vacuum applied thereto.

13. The rotatable head fixture of claim 12 further comprising
   a first and second adjustable block mounted on said upper surface and each having outwardly beveled side walls and an inwardly beveled front wall and a narrow vertical portion located on the front wall adjacent the surface opposed to the surface contiguous said upper surface, said first and second adjustable blocks being mounted on opposite sides of the aperture with one pin from each pair of pins adjacent said front wall; and
   a third and fourth adjustable block mounted on said upper surface with each having substantially vertical side walls and an inwardly beveled front wall and a narrow vertical portion located on the front wall adjacent the surface opposed to surface contiguous said upper surface, said third and fourth adjustable blocks being mounted on opposite sides of the aperture with said inwardly beveled front wall cooperating with an outwardly beveled side wall of at least one of the first and second adjustable blocks with one pair of pins located adjacent the front wall of each of the third and fourth adjustable blocks.

14. The rotatable head fixture of claim 13 wherein each adjustable block has at least one adjustable alignment and clamping screw extending therethrough in a plane parallel to said upper surface and wherein each end of the adjustable alignment screw is directed towards said aperture.

15. The rotatable head fixture of claim 14 wherein at least one of said first and second adjusting blocks has two parallel adjustable alignment and clamping screws.

16. The rotatable head fixture of claim 12 wherein said clamping means includes a lip which extends from the surface of the platen housing into engagement with a surface of a said substate to form a passageway in the vicinity of said aperture and enclosed by said substrate wherein the vacuum is applied through said aperture to the passageway to clamp a said substrate in position against the lip during rotation of this rotatable head fixture.

17. A method for forming a film of a coating material having a substantially uniform thickness on a substrate comprising the steps of
   clamping a substrate against a substrate support means with a surface to be coated positioned away from said support means;
   forming a controlled gap between the periphery of the clamped substrate and a chamber defining means;
   rotating the clamped substrate support means and chamber defining means at a rate of rotation;
   applying a volume of a said coating material onto said surface of said substrate during rotation thereof such that the centrifugal force developed during rotation of the substrate uniformly distributes said coating material across said surface in a film having an edge accumulation of said coating material around the periphery of the surface of said substrate; and
   applying to said controlled gap having a selected dimension a vacuum having a sub-ambient pressure of sufficient magnitude to draw said edge accumulation of the coating material from said surface of a said substrate through said controlled gap having a selected dimension to establish a film of substantially uniform thickness of a said coating material on said surface of a said substrate to be coated.

18. The method of claim 17 further comprising the step of
   aligning and mechanically clamping a substrate between adjusting blocks and on said substrate support means.

19. The method of claim 18 wherein said chamber defining means is adapted to be integral with said substrate support means and further comprising the step of rotating the mechanically clamped substrate and substrate support means.

20. The method of claim 17 further comprising the step of
   applying a vacuum to the lower surface of the substrate positioned over a passageway to clamp the substrate against the substrate support means; and
   rotating the vacuum clamped substrate and substrate support means.

* * * * *